United States Patent
Fujii et al.

(10) Patent No.: US 11,332,487 B2
(45) Date of Patent: May 17, 2022

(54) CYCLOPENTADIENYL NICKEL COMPLEX COMPOUND

(71) Applicant: Murata Manufacturing Co., Ltd., Nagaokakyo (JP)

(72) Inventors: Yasuo Fujii, Nagaokakyo (JP); Shigeo Yasuhara, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/819,538

(22) Filed: Mar. 16, 2020

(65) Prior Publication Data
US 2020/0216482 A1 Jul. 9, 2020

Related U.S. Application Data

(63) Continuation of application No. PCT/JP2018/038461, filed on Oct. 16, 2018.

(30) Foreign Application Priority Data

Oct. 19, 2017 (JP) .............. JP2017-202842

(51) Int. Cl.
*C07F 15/04* (2006.01)
*C23C 16/18* (2006.01)
*C23C 16/455* (2006.01)

(52) U.S. Cl.
CPC .............. *C07F 15/04* (2013.01); *C23C 16/18* (2013.01); *C23C 16/45527* (2013.01); *C23C 16/45553* (2013.01)

(58) Field of Classification Search
None
See application file for complete search history.

(56) References Cited

U.S. PATENT DOCUMENTS

2014/0023785 A1 1/2014 Knapp et al.
2016/0115587 A1 4/2016 Suzuki et al.

FOREIGN PATENT DOCUMENTS

| JP | 2006124743 A | 5/2006 |
|---|---|---|
| JP | 2010070781 A | 4/2010 |
| WO | 2014018372 A1 | 1/2014 |
| WO | 2014188629 A1 | 11/2014 |

OTHER PUBLICATIONS

Bauer, H. et al.; "Chromocene, ferrocene, cobaltocene, and nickelocene derivatives with isopropyl and methyl or trimethylsilyl substituents"; Journal of Organometallic Chemistry, 2016, 809, pp. 63-73.
Grimm, R. et al.; Comparison of the Photoelectrochemical Behavior of H-Terminated and Methyl-Terminated Si(111) Surfaces in Contact with a Series of One-Electron, Outer-Sphere Redox Couples in CH3CN; The Journal of Physical Chemistry C, 2012, 116, pp. 23569-23576.
Kohler, F. et al.; "NMR Spectroscopy on Paramagnetic Complexes, XXVII [1] Paramagnetic 1,1',2,2',3,3'4,4'-Octamethylmetallocenes"; A. Naturforsch., 1982, 376, pp. 144-150, (Abstract in English).
Kohler, F. et al.; "Preparation of New Bulky Nickelocenes via NiCl2 1.65 THF"; Transition Metal Chemistry, 1981, 6, pp. 126-127.
Weismann, D. et al.; "Cyclopentadiene Alkylation and Nickel Complexes with Tri-, Tetra-, or Pentaisopropylcyclopentadienide or an Even Bulkier Lithium Alkylcyclopentadienide"; Organometallics, 2011, 30, pp. 6351-6364.
Nesmeyanov, A.N. et al.; "Homologs of Nickelecene and Cobalticinium Salts"; Organic and Biological Chemistry, 1971, pp. 89-92, (Translated from Izvestiya Akademii Nauk SSSR, Seriya Khimicheskaya, No. 1, pp. 106-110, Jan. 1971).
International Search Report Issued for PCT/JP2018/038461, dated Jan. 8, 2019.
Written Opinion of the International Searching Authority issued for PCT/JP2018/038461, dated Jan. 8, 2019.

*Primary Examiner* — Clinton A Brooks
(74) *Attorney, Agent, or Firm* — ArentFox Schiff LLP

(57) ABSTRACT

A cyclopentadienyl nickel complex compound represented by a formula (I): $Ni(R^1{}_nC_5H_{5-n})_2$ (I), where $R^1$ is each independently a C1-4 alkyl group, and n is 2, 3, or 4.

13 Claims, No Drawings

CYCLOPENTADIENYL NICKEL COMPLEX COMPOUND

CROSS REFERENCE TO RELATED APPLICATIONS

The present application is a continuation of International application No. PCT/JP2018/038461, filed Oct. 16, 2018, which claims priority to Japanese Patent Application No. 2017-202842, filed Oct. 19, 2017, the entire contents of each of which are incorporated herein by reference.

FIELD OF INVENTION

The present disclosure relates to a new cyclopentadienyl nickel complex compound and a deposition method using the compound.

BACKGROUND OF THE INVENTION

In recent years, along with downsizing electronic components, miniaturization of constituent components included in electronic components (such as an electrode and a wiring line) has been increasingly required. Conventionally, when a metal layer such as an electrode or a wiring line is formed, physical vapor deposition, particularly vacuum vapor deposition, is utilized. Vacuum vapor deposition, however, has not always been sufficient for the formation of a fine metal layer as required in recent years.

As a method for forming a metal layer that satisfies the above requirement, Patent Document 1 discloses a method for reducing $Ni(CH_3C_5H_4)_2$ with formic acid (HCOOH) to deposit a nickel layer. Patent Document 2 discloses a method for depositing a nickel layer by a chemical vapor deposition method using $Ni(RC_5H_4)_2$ (in the formula, R is hydrogen or a C1-4 alkyl group).

However, the cyclopentadienyl derivative used in the methods of Patent Documents 1 and 2 are difficult to handle due to its tendency to solidify through polymerization and its inferiority in long-term storage stability.

Patent Document 1: Japanese Patent Application Laid-Open No. 2010-070781

Patent Document 2: Japanese Patent Application Laid-Open No. 2006-124743

SUMMARY OF THE INVENTION

An object of the present disclosure is to provide a cyclopentadienyl nickel complex compound that has excellent stability and is usable for depositing a nickel layer.

DETAILED DESCRIPTION OF THE PREFERRED EMBODIMENTS

The present inventors have found that it is possible to obtain a cyclopentadienyl nickel complex compound having excellent stability and deposition properties by introducing a plurality of C1-4 alkyl groups into a cyclopentadienyl group, as described herein.

The present disclosure provides for a cyclopentadienyl nickel complex compound represented by formula (I):

$$Ni(R^1{}_nC_5H_{5-n})_2 \qquad (I)$$

wherein $R^1$ is each independently a C1-4 alkyl group, and n is 2, 3, or 4.

The present disclosure provides for a deposition method for forming a nickel layer on a base material using the cyclopentadienyl nickel complex compound as described herein. The cyclopentadienyl nickel complex compound according to the present disclosure has a plurality of C1-4 alkyl groups on a cyclopentadienyl group, which at least in part provides high stability and deposition properties.

As described herein, the cyclopentadienyl nickel complex compound according to the present disclosure may be represented by formula (I):

$$Ni(R^1{}_nC_5H_{5-n})_2 \qquad (I)$$

wherein $R^1$ is each independently a C1-4 alkyl group. The C1-4 alkyl group may be a straight chain or a branched chain, and n is 2, 3, or 4. According to some aspects, the C1-4 alkyl group is a C1-3 alkyl group.

According to some aspects, the C1-4 alkyl group is a methyl group (hereinafter, also referred to as "Me"), an ethyl group (hereinafter, also referred to as "Et"), or an isopropyl group (hereinafter, also referred to as "iPr").

According to some aspects, when n is 2, $R^1$ may be located at positions 1 and 3 of a cyclopentadienyl group. When n is 3, $R^1$ may be located at positions 1, 2, and 4 of a cyclopentadienyl group.

According to some aspects, the cyclopentadienyl nickel complex compound represented by formula (I) may be selected from:

$Ni(Me_2C_5H_3)_2$,
$Ni(Et_2C_5H_3)_2$,
$Ni(iPr_2C_5H_3)_2$,
$Ni(MeEtC_5H_3)_2$,
$Ni(MeiPrC_5H_3)_2$,
$Ni(EtiPrC_5H_3)_2$, and
$Ni(Me_3C_5H_2)_2$.

According to some aspects, the cyclopentadienyl nickel complex compound represented by formula (I) may be selected from:

bis(1,3-dimethylcyclopentadienyl)nickel,
bis(1,3-diethylcyclopentadienyl)nickel,
bis(1,3-diisopropylcyclopentadienyl)nickel,
bis(1-methyl-3-ethylcyclopentadienyl)nickel,
bis(1-methyl-3-isopropylcyclopentadienyl)nickel,
bis(1-ethyl-3-isopropylcyclopentadienyl)nickel, and
bis(1,2,4-trimethylcyclopentadienyl)nickel.

According to some aspects, the cyclopentadienyl nickel complex compound represented by formula (I) may be selected from:

bis(1,3-dimethylcyclopentadienyl)nickel,
bis(1,3-diethylcyclopentadienyl)nickel, and
bis(1,3-diisopropylcyclopentadienyl)nickel.

The compound according to the present disclosure may be obtained, for example, by reacting a nickel complex, such as a hexaamminenickel(II) salt (e.g., hexaamminenickel(II) chloride) with a cyclopentadienyl salt having a desired substituent (e.g., cyclopentadienyl potassium).

The cyclopentadienyl nickel complex compound according to the present disclosure may have a plurality of C1-4 alkyl groups on a cyclopentadienyl group, which may at least in part provide high stability and excellent deposition properties. The present invention is not constrained by any theory, but the plurality of C1-4 alkyl groups introduced into the cyclopentadienyl group may provide appropriate steric hindrance to suppress self-polymerization and give high stability. This stabilization is also capable of suppressing a rise in temperature necessary for gasification of the compound. Further, arrangement of a C1-4 alkyl group as the substituent introduced into the cyclopentadienyl group may provide for no excessive steric hindrance and may be capable of suppressing an adverse effect on the deposition properties, thus allowing the cyclopentadienyl nickel complex compound to have excellent deposition properties.

Accordingly, the compound according to the present disclosure is suitable for use as a raw material for depositing a nickel layer.

The present disclosure also provides for a deposition method for forming a nickel layer on a base material using the cyclopentadienyl nickel complex compound according to the present disclosure.

The substrate is not particularly limited, and it is possible to use a base material comprising, for example, a metal, ceramic, or a resin. The shape of the substrate is not also limited.

According to some aspects, an atomic layer deposition method is used.

In one aspect, the cyclopentadienyl nickel complex compound according to the present disclosure may be reduced on the base material, using hydrogen or $NH_3$ as a reducing agent, to form a nickel layer. The cyclopentadienyl nickel complex compound may be gasified at a temperature of 50° C. to 70° C. The base material may be heated to 150° C. to 450° C.

In another aspect, the cyclopentadienyl nickel complex compound according to the present disclosure may be used to form a nickel oxide layer. Deposition may then be performed using diethylaluminum hydride, diisobutylaluminum hydride, or dimethylaluminum hydride to reduce the nickel oxide layer to a nickel layer and simultaneously form an aluminum oxide layer on the nickel layer.

The formation of the nickel oxide layer may be performed by a conventionally performed method. For example, the formation of the nickel oxide layer may be performed by an atomic layer deposition method using the cyclopentadienyl nickel complex compound according to the present disclosure as a raw material and oxygen as a reactive gas.

The deposition using diethylaluminum hydride, diisobutylaluminum hydride, or dimethylaluminum hydride is an aluminum deposition process. The aluminum deposition process may be performed by an atomic layer deposition method and may be performed similarly to conventionally performed methods.

The aluminum deposition process, particularly the aluminum deposition process by the atomic layer deposition method, may be performed on the nickel oxide layer to allow aluminum to deprive nickel oxide of oxygen, thus reducing the nickel oxide to nickel and oxidizing the aluminum to aluminum oxide. This process forms the nickel layer and the aluminum oxide layer on the base material.

In one aspect, the aluminum deposition process may use diethylaluminum hydride, diisobutylaluminum hydride, or dimethylaluminum hydride as the raw material, and hydrogen as the reactive gas.

The nickel layer obtained by the process described herein may have a thickness of 100 nm or less, optionally 80 nm or less, optionally 50 nm or less, optionally 30 nm or less, and optionally 20 nm or less. The nickel layer having a thickness of 100 nm or less may facilitate the formation of the layer in fine portions. Smaller thickness values for the nickel layer may facilitate the formation of the layer in even finer portions. Further, the nickel layer may have a thickness of 1 nm or more, optionally 3 nm or more, and optionally 10 nm or more. The nickel layer having a thickness of 1 nm or more may be capable of reducing the resistance and also obtaining sufficient strength. Larger thickness values of the nickel layer may enable an even higher reduction in resistance and a larger increase in strength. The nickel layer may have a thickness of 1 nm to 100 nm, optionally 3 nm to 80 nm, optionally 10 nm to 50 nm. The nickel layer may have a thickness of, for example, 30 nm or less or 20 nm or less.

The aluminum oxide layer obtained by the process described herein may have a thickness of 100 nm or less, optionally 80 nm or less, optionally 50 nm or less, optionally 30 nm or less, and optionally 20 nm or less. The aluminum oxide having a thickness of 100 nm or less may facilitate the formation of the layer in fine portions. A smaller thickness value of the aluminum oxide layer may facilitate the formation of the layer in even finer portions. Further, the aluminum oxide layer may have a thickness of 1 nm or more, optionally 3 nm or more, and optionally 10 nm or more. The aluminum oxide layer having a thickness of 1 nm or more may be capable of obtaining sufficient strength. The use of the aluminum oxide layer having a thickness of 1 nm or more as an insulating film improves the insulation properties and thus improves the reliability and the withstand voltage characteristics. A greater thickness value of the aluminum oxide layer may enable an even greater increase in strength and a further improvement of the insulating properties. According to some aspects, the aluminum oxide layer may have a thickness of 1 nm to 100 nm, optionally 3 nm to 80 nm, and optionally 10 nm to 50 nm. In one example, the aluminum oxide layer has a thickness of 30 nm or less or 20 nm or less.

In another aspect, the present disclosure also provides for a deposition method using bis(trimethylsilylcyclopentadienyl)nickel in place of the cyclopentadienyl nickel complex compound according to the present disclosure. That is, the present invention provides a deposition method for forming a nickel layer on a base material using bis(trimethylsilylcyclopentadienyl)nickel.

EXAMPLES

Example 1: Synthesis of bis(1,3-dimethylcyclopentadienyl)nickel

Hexaamminenickel(II) chloride (55 g, 237 mmol), 1,3-dimethylcyclopentadienyl potassium (64 g, 484 mmol), and dried tetrahydrofuran (500 ml) were added to a 2-L three-neck flask having the contents thereof substituted with nitrogen, and were heated to reflux for 6 hours. After solvent distillation, distillation under reduced pressure was performed to give 41 g of a green liquid having a boiling point of 80° C./0.1 Torr.

An elemental analysis gave a carbon analysis value of 68.2 w % (theoretical value 68.6 w %) and a hydrogen analysis value of 7.3 w % (theoretical value 7.4 w %). Further, a fluorescent X-ray analysis confirmed the presence of Ni. These results confirmed the acquisition of bis(1,3-dimethylcyclopentadienyl)nickel. The obtained 41 g of bis(1,3-dimethylcyclopentadienyl)nickel corresponds to 167 mmol, and the yield was 70.5%.

Example 2: Synthesis of bis(1,3-diisopropylcyclopentadienyl)nickel

Hexaamminenickel(II) chloride (40 g, 173 mmol), 1,3-diisopropylcyclopentadienyl potassium (69 g, 366 mmol), and dried tetrahydrofuran (500 ml) were added to a 2 L three-neck flask having contents thereof substituted with nitrogen, and were heated to reflux for 6 hours. After solvent distillation, distillation under reduced pressure was performed to give 47 g of a green liquid having a boiling point of 50° C./0.1 Torr.

An elemental analysis gave a carbon analysis value of 73.5 w % (theoretical value 74.0 w %) and a hydrogen analysis value of 9.5 w % (theoretical value 9.6 w %). Further, a fluorescent X-ray analysis confirmed the presence of Ni. These results confirmed the acquisition of bis(1,3-diisopropylcyclopentadienyl)nickel. The obtained 47 g of bis(1,3-diisopropylcyclopentadienyl)nickel corresponds to 132 mmol, and the yield was 76.3%.

Example 3: Synthesis of bis(1,3-diethylcyclopentadienyl) nickel

The subject compound was prepared by a method similar to the method in Examples 1 and 2.

Example 4: Synthesis of bis(1,2,4-trimethylcyclopentadienyl)nickel

The subject compound was prepared by a method similar to the method in Examples 1 and 2.

Experiment 1

An atomic layer deposition method (ALD method) was performed on a Si substrate using each of the compounds synthesized in Examples 1 to 4 at 200 deposition cycles to form a nickel film.

Table 1 below shows the compounds used and the deposition conditions. The compound of the comparative example was bis(isopropylcyclopentadienyl)nickel. A Ni film having an oxygen ratio of less than 30% and a sheet resistance of less than 500 μΩcm was determined to be "good." A Ni film that did not satisfy the above conditions was determined to be "poor." Table 1 below shows the results.

TABLE 1

| Compound | Reducing Agent | Gasification Temperature | Substrate Temperature | Ni Deposition | Long Term Storage |
|---|---|---|---|---|---|
| Example 1 | H₂ | 65° C. | 300° C. | Good | >3 months |
| Example 1 | NH₃ | 65° C. | 300° C. | Good | >3 months |
| Example 2 | H₂ | 50° C. | 400° C. | Good | >3 months |
| Example 3 | H₂ | 65° C. | 300° C. | Good | >3 months |
| Example 4 | H₂ | 70° C. | 300° C. | Good | >3 months |
| Example 4 | NH₃ | 70° C. | 300° C. | Good | >3 months |
| Comparative Example 1 | H₂ | 80° C. | 400° C. | Good | <1 month |

Example 2

The compounds synthesized in Examples 1 to 4 were stored for 3 months and then subjected to deposition to deposit a Ni film. The compound in Comparative Example 1 was stored for 1 month and then subjected to deposition, but a Ni film could not be deposited. These results are shown in Table 1, above.

The above results confirmed that the compound according to the present disclosure that has two or more substituents on the cyclopentadienyl group enables Ni deposition, and the long-term storage test confirmed that the compound according to the present disclosure is not solidified even 3 months later.

Thus, a cyclopentadienyl nickel complex compound according to the present disclosure is suitable for depositing a nickel layer.

The invention claimed is:

1. A cyclopentadienyl nickel complex compound represented by formula (I):

$$\mathrm{Ni}(R^1{}_n C_5 H_{5-n})_2 \qquad \text{(I)}$$

wherein $R^1$ is each independently a C1-3 alkyl group, and n is 2 or 3, and
wherein the cyclopentadienyl nickel complex compound is selected from the group consisting of:
Ni(Me₂C₅H₃)₂,
Ni(Et₂C₅H₃)₂,
Ni(iPr₂C₅H₃)₂,
Ni(MeEtC₅H₃)₂,
Ni(MeiPrC₅H₃)₂,
Ni(EtiPrC₅H₃)₂, and
Ni(Me₃C₅H₂)₂,
wherein Me is a methyl group, Et is an ethyl group, and iPr is an isopropyl group.

2. The cyclopentadienyl nickel complex compound according to claim 1, wherein n is 2, and $R_1$ is located at positions 1 and 3 of a cyclopentadienyl group.

3. A deposition method for forming a nickel layer on a base material, the method comprising depositing a cyclopentadienyl nickel complex compound onto the base material, the cyclopentadienyl nickel complex compound being represented by formula (I):

$$\mathrm{Ni}(R^1{}_n C_5 H_{5-n})_2 \qquad \text{(I)}$$

wherein $R^1$ is each independently a C1-3 alkyl group, and n is 2 or 3, and
wherein the cyclopentadienyl nickel complex compound is selected from the group consisting of:
Ni(Me₂C₅H₃)₂,
Ni(Et₂C₅H₃)₂,
Ni(iPr₂C₅H₃)₂,
Ni(MeEtC₅H₃)₂,
Ni(MeiPrC₅H₃)₂,
Ni(EtiPrC₅H₃)₂, and
Ni(Me₃C₅H₂)₂,
wherein Me is a methyl group, Et is an ethyl group, and iPr is an isopropyl group.

4. The deposition method according to claim 3, wherein deposition is performed by an atomic layer deposition method.

5. The deposition method according to claim 3, wherein the cyclopentadienyl nickel complex compound is reduced on the base material using hydrogen or NH₃ as a reducing agent to form the nickel layer.

6. The deposition method according to claim 5, wherein the nickel layer has a thickness of 1 nm to 100 nm.

7. The deposition method according to claim 5, wherein the nickel layer has a thickness of 30 nm or less.

8. The deposition method according to claim 3, wherein depositing the cyclopentadienyl nickel complex compound on the base layer forms a nickel oxide layer on the base material, and
wherein the method further comprises depositing diethylaluminum hydride, diisobutylaluminum hydride, or dimethylaluminum hydride onto the nickel oxide layer to simultaneously reduce the nickel oxide layer to form a nickel layer and form an aluminum oxide layer on the nickel layer.

9. The deposition method according to claim 8, wherein depositing diethylaluminum hydride, diisobutylaluminum hydride, or dimethylaluminum hydride is performed by an atomic layer deposition method.

10. The deposition method according to claim 8, wherein the aluminum oxide layer has a thickness of 1 nm to 100 nm.

11. The deposition method according to claim 8, wherein the aluminum oxide layer has a thickness of 30 nm or less.

12. The deposition method according to claim 3, wherein, wherein n is 2.

13. The deposition method according to claim 3, wherein n is 2, and $R_1$ is located at positions 1 and 3 of a cyclopentadienyl group.

* * * * *